US012575295B2

(12) United States Patent
Liu et al.

(10) Patent No.: US 12,575,295 B2
(45) Date of Patent: Mar. 10, 2026

(54) DISPLAY PANEL, METHOD FOR MANUFACTURING THE SAME, AND DISPLAY DEVICE

(71) Applicants: Hefei Xinsheng Optoelectronics Technology Co., Ltd., Anhui (CN); BOE Technology Group Co., Ltd., Beijing (CN)

(72) Inventors: Ning Liu, Beijing (CN); Qinghe Wang, Beijing (CN); Jun Liu, Beijing (CN); Hao Yin, Beijing (CN); Bin Zhou, Beijing (CN); Liangchen Yan, Beijing (CN)

(73) Assignees: Hefei Xinsheng Optoelectronics Technology Co., Ltd., Hefei (CN); BOE Technology Group Co., Ltd., Beijing (CN)

( * ) Notice: Subject to any disclaimer, the term of this patent is extended or adjusted under 35 U.S.C. 154(b) by 663 days.

(21) Appl. No.: 17/921,329

(22) PCT Filed: Nov. 9, 2021

(86) PCT No.: PCT/CN2021/129579
§ 371 (c)(1),
(2) Date: Oct. 25, 2022

(87) PCT Pub. No.: WO2022/222436
PCT Pub. Date: Oct. 27, 2022

(65) Prior Publication Data
US 2024/0389430 A1     Nov. 21, 2024

(30) Foreign Application Priority Data
Apr. 19, 2021 (CN) ........................ 202110419354.X

(51) Int. Cl.
H10K 59/12 (2023.01)
H10K 50/11 (2023.01)
(Continued)

(52) U.S. Cl.
CPC ....... H10K 59/80522 (2023.02); H10K 50/11 (2023.02); H10K 59/1201 (2023.02); H10K 59/124 (2023.02)

(58) Field of Classification Search
CPC ......... H10K 59/80552; H10K 59/1201; H10K 59/124; H10K 50/11
(Continued)

(56) References Cited

U.S. PATENT DOCUMENTS

2006/0113900 A1    6/2006   Oh
2014/0183483 A1    7/2014   Kim et al.
(Continued)

FOREIGN PATENT DOCUMENTS

CN         1825614 A      8/2006
CN         103296052 A    9/2013
(Continued)

OTHER PUBLICATIONS

Cite the machine translation Ajiki H (CN-108417600-A).*
(Continued)

*Primary Examiner* — Phuc T Dang
(74) *Attorney, Agent, or Firm* — IPro, PLLC

(57) ABSTRACT

Provided is a display panel. The display panel includes a substrate; and an insulating layer disposed on the substrate, and an auxiliary electrode, a light-emitting layer, and a cathode layer that are stacked in sequence, the insulating layer being provided with a first via, and the auxiliary electrode and the cathode layer being lapped with each other in the first via; wherein an opening in a side, distal from the substrate, of the first via is of a polygonal shape, and the (Continued)

000 light-emitting layer forms a broken line at each edge of the opening.

18 Claims, 5 Drawing Sheets

(51) Int. Cl.
 *H10K 59/124* (2023.01)
 *H10K 59/80* (2023.01)
(58) Field of Classification Search
 USPC ........................................................ 257/72
 See application file for complete search history.

(56) References Cited

U.S. PATENT DOCUMENTS

| | | | |
|---|---|---|---|
| 2016/0204171 A1 | 7/2016 | Lee et al. | |
| 2017/0040347 A1* | 2/2017 | Seo | H10K 59/8722 |
| 2017/0133620 A1 | 5/2017 | Lee et al. | |
| 2017/0278910 A1 | 9/2017 | Choi et al. | |
| 2018/0122876 A1 | 5/2018 | Shim et al. | |
| 2018/0122882 A1 | 5/2018 | Lee et al. | |
| 2018/0226606 A1 | 8/2018 | Lee et al. | |
| 2019/0221633 A1 | 7/2019 | Gai et al. | |
| 2019/0229152 A1 | 7/2019 | Wang | |
| 2020/0105789 A1 | 4/2020 | Fang et al. | |
| 2021/0083190 A1 | 3/2021 | Qu et al. | |
| 2021/0210004 A1 | 7/2021 | Zhai et al. | |
| 2021/0210588 A1 | 7/2021 | Liu et al. | |
| 2021/0367185 A1 | 11/2021 | Xiao | |
| 2022/0093894 A1 | 3/2022 | Song et al. | |

FOREIGN PATENT DOCUMENTS

| | | | | | |
|---|---|---|---|---|---|
| CN | 103915479 A | | 7/2014 | | |
| CN | 105789477 A | | 7/2016 | | |
| CN | 106992198 A | | 7/2017 | | |
| CN | 107230692 A | | 10/2017 | | |
| CN | 108022953 A | | 5/2018 | | |
| CN | 108417600 A | * | 8/2018 | ......... | H01L 27/3244 |
| CN | 108470749 A | | 8/2018 | | |
| CN | 109103215 A | | 12/2018 | | |
| CN | 109300917 A | | 2/2019 | | |
| CN | 109411505 A | | 3/2019 | | |
| CN | 109728054 A | | 5/2019 | | |
| CN | 110112190 A | | 8/2019 | | |
| CN | 110571361 A | | 12/2019 | | |
| CN | 110890406 A | | 3/2020 | | |
| CN | 110911585 A | | 3/2020 | | |
| CN | 111584574 A | | 8/2020 | | |
| CN | 112103326 A | * | 12/2020 | ......... | H01L 27/3246 |
| CN | 112310310 A | | 2/2021 | | |
| CN | 112530301 A | | 3/2021 | | |
| CN | 113130821 A | | 7/2021 | | |
| KR | 20190081624 A | * | 7/2019 | | |

OTHER PUBLICATIONS

Cite the machine translation Song Y (CN-112103326-A).*
Cite the machine translation Junhyeon B (KR-20190081624-A).*
CN202110419354.X first office action.
CN202110419354.X Notification to grant patent right for invention.

* cited by examiner

00

000

DISPLAY PANEL, METHOD FOR MANUFACTURING THE SAME, AND DISPLAY DEVICE

CROSS-REFERENCE TO RELATED APPLICATION

The present disclosure is a U.S. national stage of international application No. PCT/CN2021/129579, filed on Nov. 9, 2021, which claims priority to the Chinese Patent Application No. 202110419354.X, filed on Apr. 19, 2021 and entitled "DISPLAY PANEL, METHOD FOR MANUFACTURING THE SAME. AND DISPLAY DEVICE." the disclosures of which are incorporated herein by reference in their entireties.

TECHNICAL FIELD

The present disclosure relates to the field of display technologies, and in particular, relates to a display panel, a method for manufacturing the same, and a display device.

BACKGROUND

A conventional organic light-emitting diode (OLED) display panel generally includes an anode layer, an organic light-emitting layer, and a cathode layer. In terms of different light-emitting surfaces, OLED display panels are classified into a bottom-emission OLED display panel and a top-emission OLED display panel. Since the top-emission OLED display panel achieves a larger aperture ratio, the top-emission OLED display panel has become a research hotspot in recent years.

SUMMARY

Embodiments of the present disclosure provide a display panel, a method for manufacturing the same, and a display device. The technical solutions are as follows:

According to some embodiments of the present disclosure, a display panel is provided. The display panel includes:

a substrate; and an insulating layer disposed on the substrate, and an auxiliary electrode, a light-emitting layer, and a cathode layer stacked in sequence, the insulating layer being provided with a first via, and the auxiliary electrode and the cathode layer being lapped with each other in the first via;

wherein an opening on a side, distal from the substrate, of the first via is of a polygonal shape, and the light-emitting layer forms a broken line at each edge of the opening.

In some embodiments, the opening includes at least two strip-shaped sub-openings with extending direction being intersected with each other.

In some embodiments, center points of the at least two sub-openings are coincident.

In some embodiments, a length of an edge of the opening is less than or equal to 5 $\mu m$, and an area of the opening is greater than or equal to 50 $\mu m^2$.

In some embodiments, an included angle between a sidewall of the first via and a surface, proximal to the substrate, of the insulating layer ranges from 80 degrees to 90 degrees.

In some embodiments, the opening has more than four edges.

In some embodiments, the display panel further includes an anode layer arranged in a same layer and made from a same material as the auxiliary electrode.

In some embodiments, the display panel further includes a thin-film transistor electrically connected to the anode layer, and a cathode signal line electrically connected to the auxiliary electrode.

In some embodiments, the thin-film transistor includes a first electrode electrically connected to the anode layer, wherein the first electrode is one of a source electrode and a drain electrode; and the display panel further includes a metal light-shielding layer disposed on the substrate and electrically connected to the first electrode.

In some embodiments, the display panel further includes a pixel defining layer disposed on a side, distal from the substrate, of the insulating layer, wherein the pixel defining layer is configured to define a plurality of pixel regions on the substrate and a non-pixel region disposed on a periphery of the pixel regions, the anode layer is disposed in the pixel regions, and the auxiliary electrode is disposed in the non-pixel region:

wherein the insulating layer is further provided with a second via in the non-pixel region, and the anode layer is electrically connected to the first electrode by the second via.

According to some embodiments of the present disclosure, a method for manufacturing a display panel is provided. The method includes:

providing a substrate; and forming an insulating layer, an auxiliary electrode, a light-emitting layer, and a cathode layer on the substrate;

wherein the insulating layer is provided with a first via, the auxiliary electrode and the cathode layer are lapped with each other in the first via; and an opening on a side, distal from the substrate, of the first via is of a polygonal shape, and the light-emitting layer forms a broken line at each edge of the opening.

According to some embodiments of the present disclosure, a display device is provided. The display device includes a power supply assembly and a display panel. The power supply assembly is configured to supply power to the display panel, and the display panel includes the above display panel.

BRIEF DESCRIPTION OF THE DRAWINGS

For clearer descriptions of the technical solutions in the embodiments of the present disclosure, the following briefly introduces the accompanying drawings required for describing the embodiments. Apparently, the accompanying drawings in the following description illustrates merely some embodiments of the present disclosure, and persons of ordinary skill in the art still derive other drawings from these accompanying drawings without creative efforts.

DETAILED DESCRIPTION

For clearer descriptions of the objectives, technical solutions, and advantages of the present disclosure, embodiments of the present disclosure are described in detail hereinafter with reference to the accompanying drawings.

In some practices, the top-emission OLED display panel requires a thin and transparent cathode layer and an anode layer capable of reflecting light, to increase light transmittance. In addition, the thin and transparent cathode layer generally has a high resistance and a serious IR drop. Generally, the IR drop in the cathode layer is more obvious at a position farther away from the power supply point, which leads to uneven light emission of the OLED display panel.

At present, in the process of forming the OLED display panel, the auxiliary electrode, the organic light-emitting layer, and the cathode layer are formed in sequence. The auxiliary electrode is electrically connected to the cathode layer, and the power supply provides electrical signals for the auxiliary electrode, by which the voltage of each position in the cathode layer is the same, thereby overcoming the serious voltage drop in the cathode layer in the OLED display panel.

However, the organic light-emitting layer is generally formed by an evaporation process. In a process of forming the organic light-emitting layer by the evaporation process, the organic light-emitting layer is easily attached to the auxiliary electrode, which affects the electrical connection between the auxiliary electrode and the subsequently formed cathode layer, thereby causing poor display effect of the OLED display panel.

Figure 1:
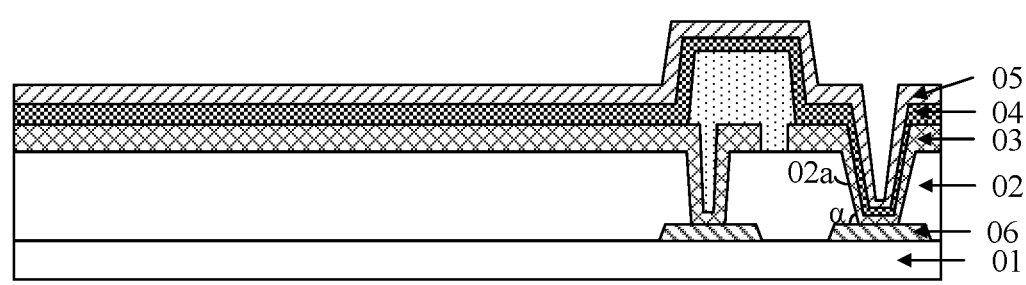
FIG. 1 is a schematic structural diagram of a display panel provided in other practices.

Referring to FIG. 1. FIG. 1 is a schematic structural diagram of a display panel provided in some other practices. The display panel 00 includes:

a substrate 01; and an insulating layer 02 disposed on the substrate 01, and an auxiliary electrode 03, a light-emitting layer 04, and a cathode layer 05 stacked in sequence.

The insulating layer 02 is provided with a via 02$a$. The light-emitting layer 04 forms a broken line in the via 02$a$, such that the auxiliary electrode 03 and the cathode layer 05 are lapped with each other in the via 02$a$.

Figure 2:
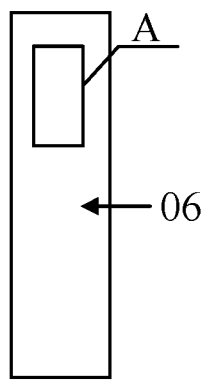
FIG. 2 is a partial top view of the display panel illustrated in FIG. 1.

Referring to FIG. 1 and FIG. 2, FIG. 2 is a partial top view of the display panel illustrated in FIG. 1. The display panel 00 further includes a cathode signal line 06. An orthographic projection of the via 02$a$ in the insulating layer 02 on the substrate 01 is within an orthographic projection of the cathode signal line 06 on the substrate 01. In this way, the auxiliary electrode 03 in the via 02$a$ is lapped with the cathode signal line 06. The cathode signal line 06 applies a voltage signal to the cathode layer 05 by the auxiliary electrode 03.

As illustrated in FIG. 2, an opening A on a side, distal from the substrate 01, of the via 02$a$ is generally of a rectangle shape. That is, the opening A has four edges connected in sequence. Among the four edges, two opposite edges have the same length, and any two adjacent edges have different lengths. Among the four edges, the two longer edges are called long edges, generally with a length of 10 $\mu$m, and the two shorter edges are called short edges, generally with a length of 5 $\mu$m.

However, as illustrated in FIG. 1, at the long edge of the via 02$a$, an angle $\alpha$ between a sidewall of the via 02$a$ and a surface, proximal to the substrate 01, of the insulating layer 02 is small, resulting in that the light-emitting layer 04 fails to form a broken line at the long edge of the via 02$a$, and then the auxiliary electrode 03 on the sidewall of the long edge of the via 02$a$ is attached with the light-emitting layer 04. The region where the light-emitting layer 04 is attached in the auxiliary electrode 03 are not effectively lapped with the cathode layer 05. In this way, a lap region of the auxiliary electrode 03 and the cathode layer 05 is reduced, which affects the electrical connection between the auxiliary electrode 03 and the cathode layer 05, thereby affecting a display effect of the display panel 00.

Figure 3:
FIG. 3 is a schematic diagram of a film layer structure of a display panel according to some embodiments of the present disclosure.
Figure 3:
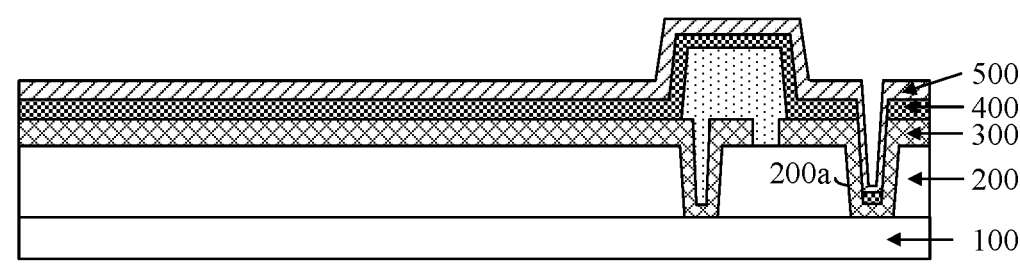

Referring to FIG. 3, FIG. 3 is a schematic diagram of a film layer structure of a display panel according to some embodiments of the present disclosure. The display panel 000 includes:

a substrate 100; and an insulating layer 200 disposed on the substrate 100, and an auxiliary electrode 300, a light-emitting layer 400, and a cathode layer 500 that are stacked in sequence.

The insulating layer 200 is provided with a first via 200$a$. The auxiliary electrode 300 and the cathode layer 500 are lapped with each other in the first via 200$a$.

An opening on a side, distal from the substrate 100, of the first via 200$a$ is of a polygonal shape. The light-emitting layer 400 in the display panel 000 forms a broken line at each edge of the opening.

In summary, the display panel according to the embodiments of the present disclosure includes a substrate, an insulating layer, an auxiliary electrode, a light-emitting layer, and a cathode layer. The auxiliary electrode and the cathode layer are lapped with each other by a first via in the insulating layer. Moreover, an opening of the first via is of a polygonal shape, such that the light-emitting layer forms a broken line at each edge of the opening. In this way, no light-emitting layer is attached to each sidewall of the auxiliary electrode in the first via, increasing the lap region between the auxiliary electrode and the cathode layer, achieving the effective lapping between the cathode layer and the auxiliary electrode, and improving the display effect of the display panel.

Figure 4:
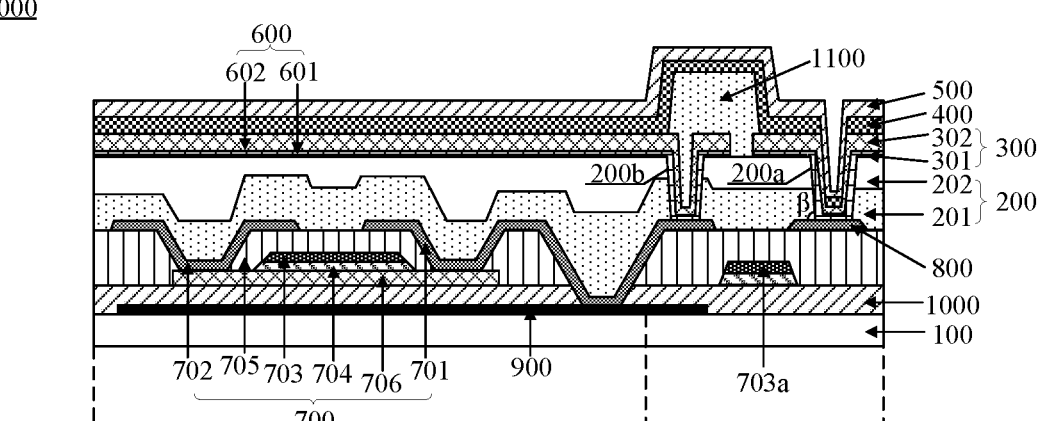
FIG. 4 is a schematic diagram of a film layer structure of another display panel according to some embodiments of the present disclosure.
Figure 5:
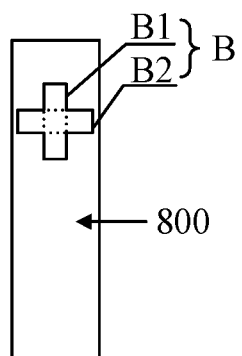
FIG. 5 is a partial top view of the display panel illustrated in FIG. 4.

In some embodiments of the present disclosure, referring to FIG. 4 and FIG. 5. FIG. 4 is a schematic diagram of a film layer structure of another display panel according to some embodiments of the present disclosure, and FIG. 5 is a partial top view of the display panel illustrated in FIG. 4. Edges of an opening B on a side, distal from the substrate 100, of the first via 200a have lengths less than or equal to 5 μm, and the opening B has an area greater than or equal to 50 μm². In this case, since the edges of the opening B in the side, distal from the substrate 100, of the first via 200a have relatively small lengths, at each edge of the opening B, an included angle β between a sidewall of the first via 200a and a surface, proximal to the substrate 100, of the insulating layer 200 is relatively large, such that the light-emitting layer 400 forms a broken line at each edge of the opening B, increasing a lap region of the auxiliary electrode 300 and the cathode layer 500. In addition, the opening B in the side, distal from the substrate 100, of the first via 200a has a relatively large area, which further increases the lap region between the auxiliary electrode 300 and the cathode layer 500, achieves an effective lapping between the cathode layer 500 and the auxiliary electrode 300, and improves a display effect of the display panel 000.

In some embodiments, the included angle β between the sidewall of the first via 200a and the surface, proximal to the substrate 100, of the insulating layer 200 ranges from 80 degrees to 90 degrees. In this way, the light-emitting layer 400 forms a broken line at each edge of the opening B.

In some embodiments of the present disclosure, the opening B in the side, distal from the substrate 100, of the first via 200a has more than 4 edges. That is, the opening B is of an irregular polygonal shape, such that the length of each edge of the opening B is less than or equal to 5 μm on the premise that the opening B has a relatively large area.

In some embodiments of the present disclosure, the opening B in the side, distal from the substrate 100, of the first via 200a includes at least two strip-shaped sub-openings with extending directions being intersected with each other, wherein center points of the at least two sub-openings are coincident.

In the present disclosure, the shape of the opening B has many possible implementations, and the following two possible implementations are taken as examples for schematic illustration in the embodiments of the present disclosure.

In a first possible implementation, as illustrated in FIG. 5, the opening B in the side, distal from the substrate 100, of the first via 200a includes two strip-shaped sub-openings B1 and B2 with extending directions being perpendicular to each other, wherein center points of the two sub-openings B1 and B2 are coincident.

Figure 6:
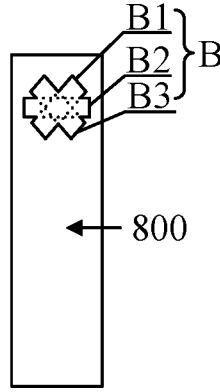
FIG. 6 is another partial top view of the display panel illustrated in FIG. 4.

In a second possible implementation, referring to FIG. 6, FIG. 6 is another partial top view of the display panel illustrated in FIG. 4. The opening B in the side, distal from the substrate 100, of the first via 200a includes three strip-shaped sub-openings B1, B2, and B3 with extending directions being intersected with each other, wherein center points of the three sub-openings B1, B2, and B3 are coincident. In this case, the opening B in the side, distal from the substrate 100, of the first via 200a has more short edges, which further increases the lap region between the auxiliary electrode 300 and the cathode layer 500.

In some embodiments of the present disclosure, as illustrated in FIG. 4, the display panel 000 further includes an anode layer 600 arranged in a same layer and made from a same material as the auxiliary electrode 300. In this way, the anode layer 600 and the auxiliary electrode 300 are formed by a one-time patterning process, which simplifies a process for manufacturing the display panel 000 and further reduces difficulty and cost for manufacturing the display panel 000.

It is noted that the one-time patterning process includes photoresist coating, exposure, development, etching, and photoresist stripping.

In some embodiments of the present disclosure, as illustrated in FIG. 4, the anode layer 600 includes a first sub-anode 601 and a second sub-anode 602 that are stacked together. The first sub-anode 601 is made from a metal with reflective properties. The anode layer 600 is an anode layer with reflective properties. In addition, in the anode layer 600, the second sub-anode 602 disposed on the first sub-anode 601 is made from an indium tin oxide (ITO) or indium zinc oxide (IZO) material. The ITO or IZO material improves the work function of the first sub-anode 601 with reflective properties, which is beneficial to improve the electrical performance of the anode layer 600. In this case, the auxiliary electrode 300 includes a first sub-electrode 301 and a second sub-electrode 302 stacked together. The first sub-electrode 301 and the first sub-anode 601 are arranged in the same layer and made from the same material. The second sub-electrode 302 and the second sub-anode 602 are arranged in the same layer and made from the same material. In this way, the first sub-electrode 301 and the first sub-anode 601 are formed by a one-time patterning process, and the second sub-electrode 302 and the second sub-anode 602 are formed by another one-time patterning process.

In the present disclosure, referring to FIG. 4, the display panel 000 further includes a thin-film transistor 700 electrically connected to the anode layer 600, and a cathode signal line 800 electrically connected to the auxiliary electrode 300. The thin-film transistor 700 is configured to apply a driving voltage to the anode layer 600. An orthographic projection of the first via 200a in the insulating layer 200 on the substrate 100 is within an orthographic projection of the cathode signal line 800 on the substrate 100. In this way, the auxiliary electrode 300 in the first via 200a is lapped with the cathode signal line 800. The cathode signal line 800 is configured to apply a cathode voltage to the cathode layer 500 by the auxiliary electrode 300. Typically, this cathode voltage is a voltage with a voltage value of zero. In the present disclosure, in the case that the driving voltage is applied to the anode layer 600 and the cathode voltage is applied to the cathode layer 500, the light-emitting layer 400 disposed between the anode layer 600 and the cathode layer 500 emits light.

In some embodiments of the present disclosure, as illustrated in FIG. 4, the thin-film transistor 700 further includes a first electrode 701 electrically connected to the anode layer 600. The first electrode 701 is one of a source electrode and a drain electrode. The display panel 000 further includes a metal light-shielding layer 900 disposed on the substrate 100 and electrically connected to the first electrode 701. In this way, during the operation of the display panel 000, a voltage of the metal light-shielding layer 900 is the same as that of the first electrode 701 and the anode layer 600, which avoids the generation of parasitic capacitance between the metal light-shielding layer 900 and other conductive structures in the display panel 000.

In the present disclosure, as illustrated in FIG. 4, the thin-film transistor 700 further includes a second electrode 702, a gate electrode 703, a gate insulating layer 704, an interlayer dielectric layer 705, and an active layer 706. The second electrode 702 is the other one of the source electrode and the drain electrode. The second electrode 702 is electrically connected to a data line. The second electrode 702 is disposed in the same layer and made from the same material as the first electrode 701 and the cathode signal line 800. The gate electrode 703 is insulated from the active layer 705 by the gate insulating layer 704 and is disposed on a side, distal from the substrate 100, of the active layer 705. The interlayer dielectric layer 705 is disposed on the gate electrode 703. The active layer 706 is lapped with the first electrode 701 and the second electrode 702. At the lap position of the active layer 706 with the first electrode 701 and the second electrode 702, conductive treatment is performed on the active layer 706 by a plasma or metal layer to reduce the resistance at the lap position of the active layer 706 with the first electrode 701 and the second electrode 702, thereby improving the characteristics of the thin-film transistor 700. An orthographic projection of the active layer 706 on the substrate 100 is within an orthographic projection of the metal light-shielding layer 900 on the substrate 100, such that the metal light-shielding layer 900 shields the active layer 706 to prevent the active layer 706 from a voltage threshold shift under the illumination of light.

The display panel 000 further includes a gate line 703a electrically connected to the gate electrode 703. The gate line 703a and the gate electrode 703 are arranged in the same layer and made from the same material.

In some embodiments of the present disclosure, the display panel 000 further includes a buffer layer 1000 disposed on the metal light-shielding layer 900. The buffer layer 1000 is configured to block ions in the substrate 100 from entering the active layer 705, thereby protecting the performance of the active layer 705 in the case that the ions enter the active layer 705.

In some embodiments, as illustrated in FIG. 4, the insulating layer 200 in the display panel 000 further includes a passivation layer 201 and a planarization layer 202.

In some embodiments of the present disclosure, as illustrated in FIG. 4, the display panel 000 further includes a pixel defining layer 1100 disposed on a side, distal from the substrate 100, of the insulating layer 200. The pixel defining layer 1100 is configured to define a plurality of pixel regions 100a on the substrate 100 and a non-pixel region 100b disposed at the periphery of the pixel region 100a. The anode layer 600 is disposed in the pixel regions 100a. The auxiliary electrode 300 is disposed in the non-pixel region 100b. The first via 200a in the insulating layer 200 in the display panel 000 is disposed in the non-pixel region 100b. The insulating layer 200 is further provided with a second via 200b in the non-pixel region. An orthographic projection of the second via 200b on the substrate 100 is within an orthographic projection of the pixel defining layer 1100 on the substrate 100. The anode layer 600 is electrically connected to the first electrode 701 by the second via 200b. In this way, the planarization of the anode layer 600 is improved to reduce color separation in the display panel 000 due to the poor planarization of the anode layer 600.

It is noted that the anode layer 600 as well as the light-emitting layer 400 and the cathode layer 500 disposed in the pixel regions 100a constitutes an OLED light-emitting device in the display panel 000.

Figures 7, 8, 9, 10:
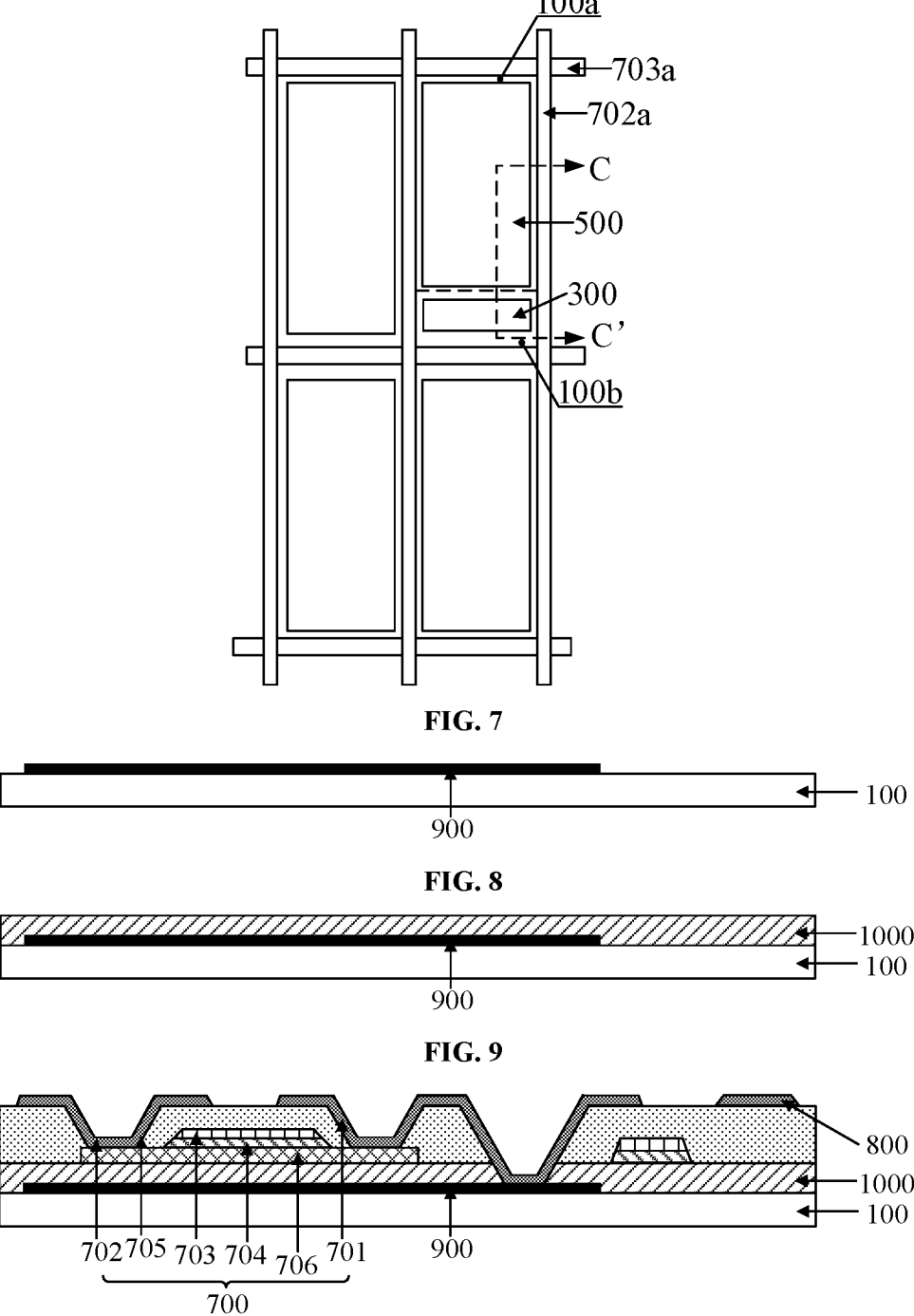
FIG. 7 is a top view of a display panel according to some embodiments of the present disclosure.
FIG. 8 is a schematic diagram of forming a metal light-shielding layer according to some embodiments of the present disclosure.
FIG. 9 is a schematic diagram of forming a buffer layer according to some embodiments of the present disclosure.
FIG. 10 is a schematic diagram of forming a thin-film transistor according to some embodiments of the present disclosure.

Optionally, referring to FIG. 7, FIG. 7 is a top view of a display panel according to some embodiments of the present disclosure. In FIG. 7, for a cross-sectional view of a display panel 000 at C-C', reference may be made to the schematic diagram of the film layer structure of the display panel illustrated in FIG. 3 or FIG. 5. An extending direction of the gate line 703a in the display panel 000 is perpendicular to an extending direction of the data line 702a.

In some embodiments of the present disclosure, a plurality of auxiliary electrodes 300 are disposed in the non-pixel region 100b at the periphery of the pixel regions 100a in the display panel 000. The number and arrangement of the auxiliary electrodes 300 in the display panel 000 are determined according to a resistance of the cathode layer 500. For example, one auxiliary electrode 300 is disposed in every 2×2 pixels: or, one auxiliary electrode 300 is disposed in every 3×3 pixels.

In summary, the display panel according to the embodiments of the present disclosure includes a substrate, an insulating layer, an auxiliary electrode, a light-emitting layer, and a cathode layer. The auxiliary electrode and the cathode layer are lapped with each other by a first via in the insulating layer. Moreover, an opening of the first via is of a polygonal shape, such that the light-emitting layer forms a broken line at each edge of the opening. In this way, no light-emitting layer is attached to each sidewall of the auxiliary electrode in the first via, increasing the lap region between the auxiliary electrode and the cathode layer, achieving the effective lapping between the cathode layer and the auxiliary electrode, and improving the display effect of the display panel.

Some embodiments of the present disclosure further provide a method for manufacturing a display panel. The manufacturing method is intended to manufacture the display panel illustrated in FIG. 3. The method includes the following steps.

In step A1, a substrate is provided.

In step A2, an insulating layer, an auxiliary electrode, a light-emitting layer, and a cathode layer are formed on the substrate.

The insulating layer is provided with a first via. The auxiliary electrode and the cathode layer are lapped with each other in the first via. An opening on a side, distal from the substrate, of the first via is of a polygonal shape. The light-emitting layer forms a broken line at each edge of the opening.

In summary, in the method for manufacturing the display panel according to the embodiment of the present disclosure, the auxiliary electrode and the cathode layer are lapped with each other by a first via in the insulating laver. Moreover, an opening of the first via is of a polygonal shape, such that the light-emitting layer forms a broken line at each edge of the opening. In this way, no light-emitting layer is attached to each sidewall of the auxiliary electrode in the first via, increasing the lap region between the auxiliary electrode and the cathode layer, achieving the effective lapping between the cathode layer and the auxiliary electrode, and improving the display effect of the display panel.

In some embodiments of the present disclosure, another method for manufacturing a display panel is also provided. The method for manufacturing the display panel is intended to manufacture the display panel illustrated in FIG. 4. The method for manufacturing the display panel further includes the following steps.

In step B1, a substrate is provided.

The substrate may be made from glass or polyimide.

In step B2, a metal light-shielding layer is formed on the substrate.

In some embodiments of the present disclosure, as illustrated in FIG. 8, FIG. 8 is a schematic diagram of forming a metal light-shielding layer according to some embodiments of the present disclosure. A first conductive layer is formed on a substrate 100, and a one-time patterning process is performed on the first conductive layer to form the metal light-shielding layer 900. In some embodiments, the metal light-shielding layer 900 may be made from a metal material such as metal aluminum, metal silver, metal molybdenum, or an alloy.

In step B3, a buffer layer is formed on the metal light-shielding layer.

In some embodiments of the present disclosure, as illustrated in FIG. 9, FIG. 9 is a schematic diagram of forming a buffer layer according to some embodiments of the present disclosure. In some embodiments, the buffer layer 1000 may be made from an inorganic material such as silicon nitride, silicon oxide, or silicon oxynitride. In the present disclosure, a thickness of the buffer layer 1000 ranges from 0.6 to 3 μm.

In step B4, a thin-film transistor is formed on the buffer layer.

In some embodiments of the present disclosure, as illustrated in FIG. 10, FIG. 10 is a schematic diagram of forming a thin-film transistor according to some embodiments of the present disclosure.

In the present disclosure, forming the thin-film transistor 700 on the buffer layer 1000 includes the following steps.

First, an active material film is formed on the substrate 100 on which the buffer layer 1000 is formed, and a one-time patterning process is performed on the active material film to form an active layer 706. In some embodiments, the active layer 706 may be made from a semiconductor material such as polysilicon, amorphous silicon, or oxide semiconductor.

Thereafter, a gate insulating film is formed on the substrate 100 on which the active layer 706 is formed, and a one-time patterning process is performed on the gate insulating film to form a gate insulating layer 704.

Thereafter, a second conductive layer is formed on the substrate on which the gate insulating layer 704 is formed, and a one-time patterning process is performed on the second conductive layer to form a gate electrode 703 and a gate line 703a. In some embodiments, the gate electrode 703 and the gate line 703a may be made from a metal material such as metal aluminum, metal silver, metal molybdenum, or an alloy.

Thereafter, an interlayer dielectric film is formed on the substrate on which the gate electrode 703 and the gate line 703a are formed, and a one-time patterning process is performed on the interlayer dielectric film to form an interlayer dielectric layer 705. In some embodiments, the interlayer dielectric layer 705 may be made from silicon dioxide, silicon nitride, or a mixed material of silicon dioxide and silicon nitride.

Finally, a third conductive layer is formed on the substrate on which the interlayer dielectric layer is formed, and a one-time patterning process is performed on the third conductive layer to form a first electrode 701, a second electrode 702, a cathode signal line 800, and a data line (not illustrated in the figure). In some embodiments, the first electrode 701, the second electrode 702, the cathode signal line 800, and the data line may be made from a metal material such as metal aluminum, metal silver, metal molybdenum or an alloy.

It is noted that the thin-film transistor 700 is formed by the above process. It is also noted that the one-time patterning process in the above embodiments includes photoresist coating, exposure, development, etching, and photoresist stripping.

In step B5, an insulating layer is formed on the thin-film transistor.

Figure 11:
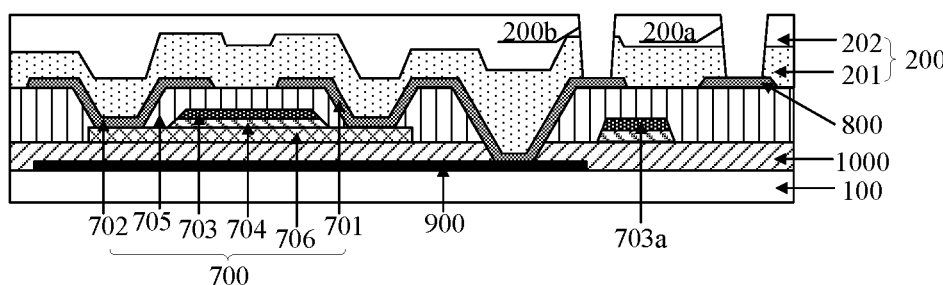
FIG. 11 is a schematic diagram of forming an insulating layer according to some embodiments of the present disclosure.

In some embodiments of the present disclosure, as illustrated in FIG. 11, FIG. 11 is a schematic diagram of forming an insulating layer according to some embodiments of the present disclosure. A passivation layer 201 and a planarization layer 202 are sequentially formed on substrate on which the thin-film transistor is formed. In some embodiments of the present disclosure, the passivation layer 201 is formed by chemical vapor deposition using plasma, and a planarization film is formed on the passivation layer 201 and a one-time patterning process is performed on the planarization film to form the planarization layer 202. The passivation layer 201 and the planarization layer 202 form an insulating layer 200. The insulating layer is provided with a first via 200a and a second via 200b.

In step B6, an anode layer and an auxiliary electrode are formed on the insulating layer.

Figure 12:
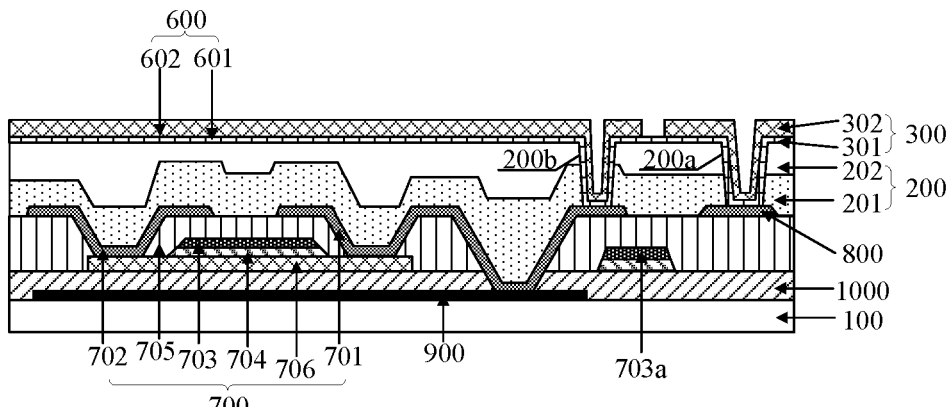
FIG. 12 is a schematic diagram of forming an anode layer and an auxiliary electrode according to some embodiments of the present disclosure.

In some embodiments of the present disclosure, as illustrated in FIG. 12. FIG. 12 is a schematic diagram of forming an anode layer and an auxiliary electrode according to some embodiments of the present disclosure. A fourth conductive film is formed on a substrate 100 on which an insulating layer 200 is formed, and then, a one-time patterning process is performed on the fourth conductive film to form the anode layer 600 and the auxiliary electrode 300.

In step B7, a pixel defining layer is formed on the substrate on which the anode layer and the auxiliary electrode are formed.

Figure 13:
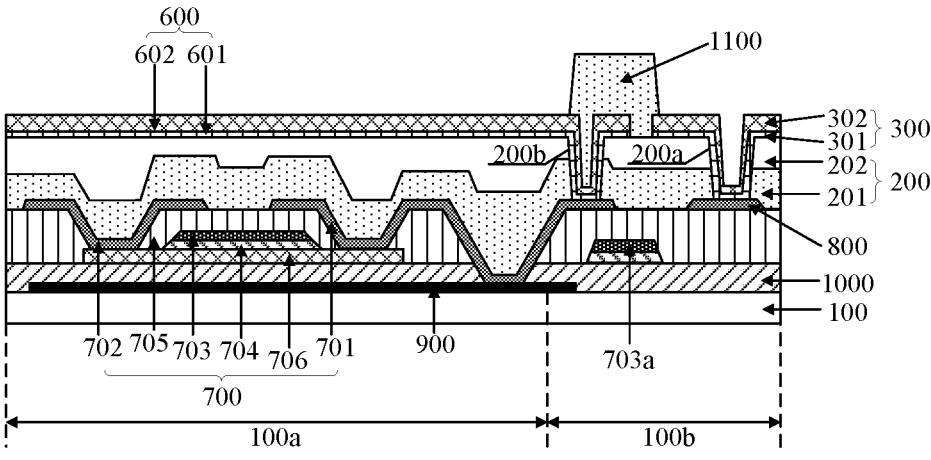
FIG. 13 is a schematic diagram of forming a pixel defining layer according to some embodiments of the present disclosure.

In some embodiments of the present disclosure, as illustrated in FIG. 13, FIG. 13 is a schematic diagram of forming a pixel defining layer according to some embodiments of the present disclosure. The pixel defining layer 1100 is configured to define a pixel region 100a and a non-pixel region 100b on a substrate 100. In some embodiments, the pixel defining layer 1100 is made from at least one of polymethyl methacrylate and polystyrene-based polymers, phenolic-based polymers and derivatives, acrylic-based polymers, para-xylene-based polymers, aryl ether-based polymers, amide-based polymers, fluoride-based polymers, para-xylene-based polymers, and vinyl alcohol-based polymers.

In step B8, a light-emitting layer is formed on the pixel defining layer.

Figure 14:
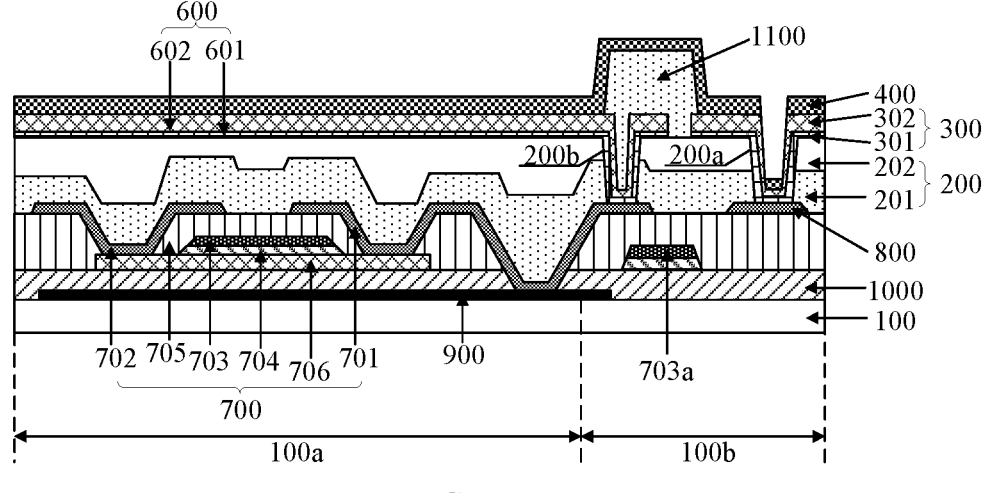
FIG. 14 is a schematic diagram of forming a light-emitting layer according to some embodiments of the present disclosure.

In some embodiments of the present disclosure, as illustrated in FIG. 14. FIG. 14 is a schematic diagram of forming a light-emitting layer according to some embodiments of the present disclosure. The light-emitting layer 400 forms a broken line at each edge of a first via 200a. In some embodiments, the light-emitting layer 400 may be made from a phosphorescent or fluorescent light-emitting material.

In step B9, a cathode layer is formed on the light-emitting layer.

Figure 15:
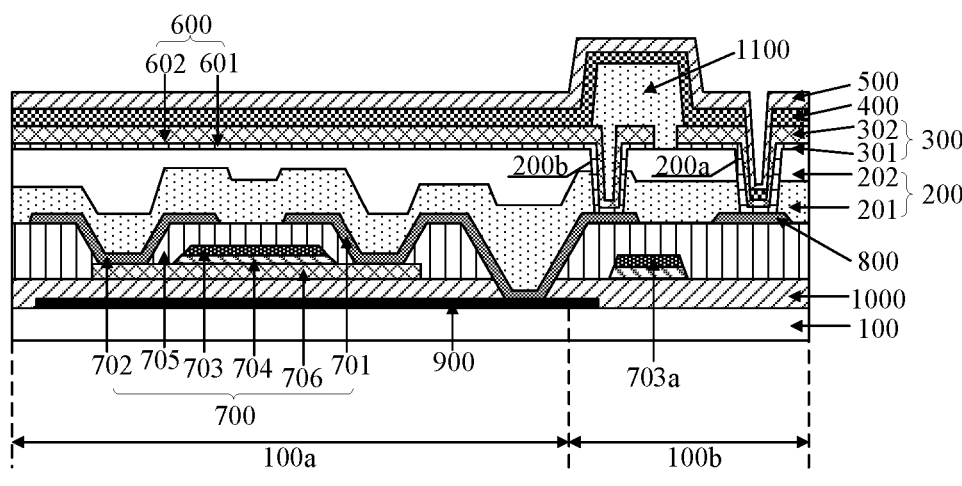
FIG. 15 is a schematic diagram of forming a cathode layer according to some embodiments of the present disclosure.

In some embodiments of the present disclosure, as illustrated in FIG. 15. FIG. 15 is a schematic diagram of forming a cathode layer according to some embodiments of the present disclosure. In some embodiments, the cathode layer 500 may be made from an ITO or IZO material.

In some embodiments of the present disclosure, in the case that the cathode layer 500 is formed on the light-emitting layer 400, the display panel illustrated in FIG. 4 is obtained. In some embodiments of the present disclosure, the cathode layer 500 is formed on the substrate 100 on which the light-emitting layer 400 is formed by a sputtering process, such that the formed cathode layer 500 and the auxiliary electrode 300 are lapped with each other in the first via.

It is noted that, the one-time patterning process in the above embodiments includes photoresist coating, exposure, development, etching, and photoresist stripping.

Those skilled in the art clearly understand that, for the convenience and brevity of description, the working principles and connection relationships of the various structures in the display panel described above refer to the corresponding content in the foregoing embodiments of the structure of the display panel, which will not be repeated here.

In summary, in the method for manufacturing the display panel according to the embodiments of the present disclosure, the auxiliary electrode and the cathode layer are lapped with each other by a first via in the insulating layer. Moreover, an opening of the first via is of a polygonal shape, such that the light-emitting layer forms a broken line at each edge of the opening. In this way, no light-emitting layer is attached to each sidewall of the auxiliary electrode in the first via, increasing the lap region between the auxiliary electrode and the cathode layer, achieving the effective lapping between the cathode layer and the auxiliary electrode, and improving the display effect of the display panel.

Some embodiments of the present disclosure further provide a display device. The display device includes the above display panel. For example, for the film layer structure of the display panel, reference may be made to FIG. 3 or FIG. 4.

The display device may be any product or component with a display function, such as a mobile phone, a tablet computer, a TV, a monitor, a notebook computer, a digital photo frame, a navigator, and the like.

It is noted that, in the drawings, sizes of layers and regions are exaggerated for clarity of illustration. It is also understood that in the case that an element or layer is referred to as being "on" another element or layer, the element or layer is directly on the other element or an intervening layer is present. In addition, it is understood that in the case that an element or layer is referred to as being "under" another element or layer, the element or layer is directly under the other element, or more than one intervening layer or element is present. In addition, it is also understood that in the case that a layer or element is referred to as being 'between' two layers or elements, the layer or element is the only layer or element between the two layers or elements, or one or more intervening layers or elements are also present. Like reference numerals indicate like elements throughout.

In the present disclosure, the terms "first" and "second" are used for descriptive purposes only, and are not construed to indicate or imply relative importance. The term "a plurality of" refers to two or more, unless expressly limited otherwise.

Described above are merely exemplary embodiments of the present disclosure, and are not intended to limit the present disclosure. Within the spirit and principles of the disclosure, any modifications, equivalent substitutions, improvements, and the like are within the protection scope of the present disclosure.

What is claimed is:

1. A display panel, comprising:
a substrate; and
an insulating layer disposed on the substrate, and an auxiliary electrode, a light-emitting layer, and a cathode layer that are stacked in sequence, the insulating layer being provided with a first via, and the auxiliary electrode and the cathode layer being lapped with each other in the first via;
wherein an opening in a side, distal from the substrate, of the first via is of a polygonal shape, and the light-emitting layer forms a broken line at each edge of the opening;

wherein the opening comprises at least two strip-shaped sub-openings with extending directions being intersected with each other.

2. The display panel according to claim 1, wherein center points of the at least two sub-openings are coincident.

3. The display panel according to claim 1, wherein a length of an edge of the opening is less than or equal to 5 μm, and an area of the opening is greater than or equal to 50 μm².

4. The display panel according to claim 1, wherein an included angle between a sidewall of the first via and a surface, proximal to the substrate, of the insulating layer ranges from 80 degrees to 90 degrees.

5. The display panel according to claim 1, wherein the opening has more than four edges.

6. The display panel according to claim 1, further comprising:
an anode layer arranged in a same layer and made from a same material as the auxiliary electrode.

7. The display panel according to claim 6, further comprising:
a thin-film transistor electrically connected to the anode layer, and a cathode signal line electrically connected to the auxiliary electrode.

8. The display panel according to claim 7, wherein
the thin-film transistor comprises a first electrode electrically connected to the anode layer, the first electrode being one of a source electrode and a drain electrode; and
the display panel further comprises a metal light-shielding layer disposed on the substrate and electrically connected to the first electrode.

9. The display panel according to claim 8, further comprising:
a pixel defining layer disposed on a side, distal from the substrate, of the insulating layer, wherein the pixel defining layer is configured to define a plurality of pixel regions on the substrate and a non-pixel region disposed on a periphery of the pixel regions, the anode layer is disposed in the pixel regions, and the auxiliary electrode is disposed in the non-pixel region;
wherein the insulating layer is further provided with a second via in the non-pixel region, and the anode layer is electrically connected to the first electrode by the second via.

10. A method for manufacturing a display panel, comprising:
providing a substrate; and
forming an insulating layer, an auxiliary electrode, a light-emitting layer, and a cathode layer on the substrate;
wherein the insulating layer is provided with a first via, the auxiliary electrode and the cathode layer are lapped with each other in the first via; and an opening in a side, distal from the substrate, of the first via is of a polygonal shape, and the light-emitting layer forms a broken line at each edge of the opening;
wherein the opening comprises at least two strip-shaped sub-openings with extending directions being intersected with each other.

11. A display device, comprising: a power supply assembly and a display panel, wherein power supply assembly is configured to supply power to the display panel, wherein the display panel comprises:
a substrate; and
an insulating layer disposed on the substrate, and an auxiliary electrode, a light-emitting layer, and a cathode layer that are stacked in sequence, the insulating layer being provided with a first via, and the auxiliary electrode and the cathode layer being lapped with each other in the first via;

wherein an opening in a side, distal from the substrate, of the first via is of a polygonal shape, and the light-emitting layer forms a broken line at each edge of the opening;

wherein the opening comprises at least two strip-shaped sub-openings with extending directions being intersected with each other.

12. The display device according to claim 11, wherein center points of the at least two sub-openings are coincident.

13. The display device according to claim 11, wherein a length of an edge of the opening is less than or equal to 5 μm, and an area of the opening is greater than or equal to 50 μm².

14. The display device according to claim 11, wherein an included angle between a sidewall of the first via and a surface, proximal to the substrate, of the insulating layer ranges from 80 degrees to 90 degrees.

15. The display device according to claim 11, wherein the opening has more than four edges.

16. The display device according to claim 11, wherein the display panel further comprises:

an anode layer arranged in a same layer and made from a same material as the auxiliary electrode.

17. The display device according to claim 16, wherein the display panel further comprises:

a thin-film transistor electrically connected to the anode layer, and a cathode signal line electrically connected to the auxiliary electrode.

18. The display device according to claim 17, wherein the thin-film transistor comprises a first electrode electrically connected to the anode layer, the first electrode being one of a source electrode and a drain electrode; and the display panel further comprises a metal light-shielding layer disposed on the substrate and electrically connected to the first electrode.

* * * * *